(12) United States Patent
Harutyunyan et al.

(10) Patent No.: US 9,174,847 B2
(45) Date of Patent: Nov. 3, 2015

(54) SYNTHESIS OF HIGH QUALITY CARBON SINGLE-WALLED NANOTUBES

(75) Inventors: Avetik R. Harutyunyan, Columbus, OH (US); Oleg Kuznetsov, Columbus, OH (US)

(73) Assignee: Honda Motor Co., LTD., Tokyo (JP)

( * ) Notice: Subject to any disclaimer, the term of this patent is extended or adjusted under 35 U.S.C. 154(b) by 0 days.

(21) Appl. No.: 12/113,819

(22) Filed: May 1, 2008

(65) Prior Publication Data

US 2009/0274609 A1 Nov. 5, 2009

(51) Int. Cl.
| | |
|---|---|
| *D01C 5/00* | (2006.01) |
| *D01F 9/12* | (2006.01) |
| *C01B 31/02* | (2006.01) |
| *B82Y 30/00* | (2011.01) |
| *B82Y 40/00* | (2011.01) |

(52) U.S. Cl.
CPC .............. *C01B 31/0233* (2013.01); *B82Y 30/00* (2013.01); *B82Y 40/00* (2013.01); *C01B 2202/02* (2013.01)

(58) Field of Classification Search
USPC .................................. 423/447.1, 447.3, 447.5
See application file for complete search history.

(56) References Cited

U.S. PATENT DOCUMENTS

| | | | |
|---|---|---|---|
| 4,770,867 A | 9/1988 | Coulon et al. | |
| 5,578,543 A | 11/1996 | Tennent et al. | |
| 5,587,240 A | 12/1996 | Kobayashi et al. | |
| 5,593,740 A * | 1/1997 | Strumban et al. | 427/577 |
| 5,690,997 A | 11/1997 | Grow | |
| 6,692,717 B1 * | 2/2004 | Smalley et al. | 423/445 B |
| 6,716,409 B2 * | 4/2004 | Hafner et al. | 423/447.1 |
| 6,730,284 B2 * | 5/2004 | Harutyunyan et al. | 423/447.3 |
| 6,752,977 B2 * | 6/2004 | Smalley et al. | 423/447.1 |
| 6,761,870 B1 * | 7/2004 | Smalley et al. | 423/447.3 |
| 6,764,874 B1 | 7/2004 | Zhang et al. | |
| 6,869,583 B2 * | 3/2005 | Harutyunyan et al. | 423/461 |
| 6,890,506 B1 * | 5/2005 | Harutyunyan et al. | 423/447.3 |

(Continued)

FOREIGN PATENT DOCUMENTS

| | | |
|---|---|---|
| JP | 2005-350349 A | 12/2005 |
| JP | 2006-036593 A | 2/2006 |

(Continued)

OTHER PUBLICATIONS

Harutyunyan, A., et al., "CVD Synthesis of Single Wall Carbon Nanotubes Under "Soft" Conditions," NanoLetters, 2002, pp. 525-530, vol. 2, No. 5.

(Continued)

*Primary Examiner* — Kaj K Olsen
*Assistant Examiner* — Ross J Christie
(74) *Attorney, Agent, or Firm* — Fenwick & West LLP

(57) ABSTRACT

Methods and processes for synthesizing high quality carbon single-walled nanotubes (SWNTs) are provided. A carbon precursor gas at reduced concentration (pressure) is contacted with a catalyst deposited on a support and at temperature about 10° C. above the SWNT synthesis onset temperature, but below the thermal decomposition temperature of the carbon precursor gas for given growth conditions. The concentration (pressure) of the carbon precursor gas can be controlled by reducing the total pressure of the gas, or by diluting with an inert carrier gas, or both. The methods produce SWNTs with the ratio of G-band to D-band in Raman spectra ($I_G$:$I_D$) of about 5 to about 200.

13 Claims, 4 Drawing Sheets

(56) References Cited

U.S. PATENT DOCUMENTS

| | | | |
|---|---|---|---|
| 6,913,789 B2 * | 7/2005 | Smalley et al. | 427/249.1 |
| 6,949,237 B2 * | 9/2005 | Smalley et al. | 423/447.3 |
| 6,974,492 B2 * | 12/2005 | Harutyunyan et al. | 75/351 |
| 6,974,493 B2 * | 12/2005 | Harutyunyan et al. | 75/362 |
| 6,986,877 B2 | 1/2006 | Takikawa et al. | |
| 7,014,737 B2 * | 3/2006 | Harutyunyan et al. | 423/461 |
| 7,052,668 B2 * | 5/2006 | Smalley et al. | 423/447.3 |
| 7,090,819 B2 * | 8/2006 | Smalley et al. | 423/447.6 |
| 7,150,865 B2 * | 12/2006 | Harutyunyan et al. | 423/460 |
| 7,204,970 B2 * | 4/2007 | Smalley et al. | 423/447.2 |
| 7,214,361 B2 * | 5/2007 | Harutyunyan et al. | 423/447.3 |
| 7,250,148 B2 | 7/2007 | Yang et al. | |
| 7,338,648 B2 * | 3/2008 | Harutyunyan et al. | 423/447.3 |
| 7,651,668 B2 | 1/2010 | Nakayama et al. | |
| 2002/0102193 A1 * | 8/2002 | Smalley et al. | 423/447.3 |
| 2002/0102194 A1 * | 8/2002 | Smalley et al. | 423/447.1 |
| 2002/0102203 A1 * | 8/2002 | Smalley et al. | 423/447.3 |
| 2002/0112814 A1 * | 8/2002 | Hafner et al. | 156/272.2 |
| 2002/0127171 A1 * | 9/2002 | Smalley et al. | 423/447.6 |
| 2002/0159944 A1 * | 10/2002 | Smalley et al. | 423/447.6 |
| 2004/0050686 A1 * | 3/2004 | Huang et al. | 204/173 |
| 2004/0091416 A1 * | 5/2004 | Harutyunyan et al. | 423/447.3 |
| 2004/0101467 A1 * | 5/2004 | Harutyunyan et al. | 423/447.3 |
| 2004/0223901 A1 * | 11/2004 | Smalley et al. | 423/447.3 |
| 2004/0265210 A1 * | 12/2004 | Shinohara et al. | 423/447.3 |
| 2004/0265211 A1 * | 12/2004 | Dillon et al. | 423/447.3 |
| 2005/0002851 A1 * | 1/2005 | McElrath et al. | 423/447.3 |
| 2005/0079118 A1 * | 4/2005 | Maruyama et al. | 423/447.3 |
| 2005/0287297 A1 | 12/2005 | Biris et al. | |
| 2006/0078489 A1 * | 4/2006 | Harutyunyan et al. | 423/447.3 |
| 2006/0093545 A1 * | 5/2006 | Maruyama et al. | 423/447.3 |
| 2006/0099136 A1 * | 5/2006 | Dillon et al. | 423/447.3 |
| 2006/0104889 A1 | 5/2006 | Harutyunyan et al. | |
| 2006/0104890 A1 * | 5/2006 | Harutyunyan et al. | 423/447.3 |
| 2006/0223191 A1 * | 10/2006 | Harutyunyan et al. | 436/173 |
| 2006/0228289 A1 * | 10/2006 | Harutyunyan et al. | 423/447.3 |
| 2006/0239893 A1 * | 10/2006 | Zhang et al. | 423/445 R |
| 2006/0245996 A1 * | 11/2006 | Xie et al. | 423/445 R |
| 2006/0284538 A1 * | 12/2006 | Harutyunyan | 427/78 |
| 2007/0085460 A1 * | 4/2007 | Harutyunyan et al. | 313/309 |
| 2007/0116629 A1 * | 5/2007 | Harutyunyan et al. | 423/447.3 |
| 2007/0116632 A1 * | 5/2007 | Harutyunyan | 423/447.3 |
| 2007/0281087 A1 * | 12/2007 | Harutyunyan et al. | 427/249.1 |
| 2008/0175786 A1 * | 7/2008 | Zhang et al. | 423/447.3 |
| 2008/0175787 A1 * | 7/2008 | Ma et al. | 423/593.1 |
| 2008/0176069 A1 * | 7/2008 | Ma et al. | 428/367 |
| 2008/0213138 A1 | 9/2008 | Nakayama et al. | |
| 2008/0279753 A1 * | 11/2008 | Harutyunyan | 423/447.2 |
| 2008/0318049 A1 * | 12/2008 | Hata et al. | 423/447.2 |
| 2009/0220409 A1 | 9/2009 | Curliss et al. | |
| 2009/0274609 A1 * | 11/2009 | Harutyunyan et al. | 423/445 B |
| 2010/0098904 A1 * | 4/2010 | Dai et al. | 428/119 |
| 2010/0124530 A1 * | 5/2010 | Lusk et al. | 423/447.3 |
| 2010/0239491 A1 * | 9/2010 | Harutyunyan | 423/447.3 |
| 2010/0254886 A1 * | 10/2010 | McElrath et al. | 423/447.2 |

FOREIGN PATENT DOCUMENTS

| | | |
|---|---|---|
| JP | 2006-511437 A | 4/2006 |
| JP | 2006-278505 A | 10/2006 |
| JP | 2006-298684 A | 11/2006 |
| JP | 2007-070224 A | 3/2007 |
| JP | 2007-291591 A | 11/2007 |
| JP | 2007-326751 A | 12/2007 |
| JP | 2008-512343 A | 4/2008 |
| WO | WO 0017102 A1 * | 3/2000 |
| WO | WO 02083556 A2 * | 10/2002 |
| WO | WO 03040446 A2 * | 5/2003 |
| WO | WO 03057955 A1 * | 7/2003 |
| WO | WO 2006003482 A2 * | 1/2006 |
| WO | WO 2006/050903 | 5/2006 |
| WO | WO 2006091277 A2 * | 8/2006 |
| WO | WO 2007035241 A2 * | 3/2007 |
| WO | WO 2007/093337 | 8/2007 |
| WO | WO 2007125923 A1 * | 11/2007 |

OTHER PUBLICATIONS

Ivanov, V., et al., "The Study of Carbon Nanobutules Produced by Catalytic Method," Chemical Physics Letters, Jun. 24, 1994, pp. 329-335, vol. 223.

Journet, C., et al., "Large-Scale Production of Single-Walled Carbon Nanotubes by the Electric-Arc Technique," Nature, Aug. 21, 1997, pp. 756-758, vol. 388.

Li, W. Z., et al., "Large-Scale Synthesis of Aligned Carbon Nanotubes," Science, Dec. 6, 1996, pp. 1701-1703, vol. 274.

Thess, A., et al., "Crystalline Ropes of Metallic Carbon Nanotubes," Science, Jul. 26, 1996, pp. 483-487, vol. 273.

U.S. Appl. No. 10/992,275, filed Nov. 17, 2004 (Copy not included).

U.S. Appl. No. 10/727,707, filed Dec. 3, 2003 (Copy not included).

PCT International Search Report and Written Opinion, PCT Application No. PCT/US2009/040958, Mar. 5, 2010, 9 pages.

Hoffman, S. et al., "Low-temperature growth of carbon nanotubes by plasma-enhanced chemical vapor deposition," *Applied Physics Letters*, Jul. 7, 2003, pp. 135-137, vol. 83, No. 1.

Kim, D-H. et al., "Dynamic Growth Rate Behavior of a Carbon Nanotube Forest Characterized by in Situ Optical Growth Monitoring," *Nano Letters*, 2003, pp. 863-865, vol. 3, No. 6.

Mora, E. et al., "Study of Single-Walled Carbon Nanotubes Growth via the Catalyst Lifetime," Journal of Physical Chemistry, 2008, vol. 112, pp. 4805-4812.

PCT International Search Report and Written Opinion, PCT Application No. PCT/US2009/040959, Apr. 13, 2010, 5 pages.

United States Office Action, U.S. Appl. No. 12/113,814, Nov. 6, 2012, twenty pages.

Japanese Patent Office, Office Action, Japanese Patent Application No. 2011-507534, Oct. 15, 2013, eight pages.

Japanese Patent Office, Office Action, Japanese Patent Application No. 2011-507533, Oct. 15, 2013, twelve pages.

Japanese Patent Office, Office Action, Japanese Patent Application No. 2011-507533, Jul. 22, 2014, nine pages.

\* cited by examiner

SYNTHESIS OF HIGH QUALITY CARBON SINGLE-WALLED NANOTUBES

FIELD OF INVENTION

The present invention relates to methods for the synthesis of carbon single-walled nanotubes using chemical vapor deposition method.

BACKGROUND

Carbon nanotubes are hexagonal networks of carbon atoms forming seamless tubes with each end capped with half of a fullerene molecule. Presently, there are three main approaches for the synthesis of single- and multi-walled carbon nanotubes. These include the electric arc discharge of graphite rod (Journet et al. Nature 388: 756 (1997)), the laser ablation of carbon (Thess et al. Science 273: 483 (1996)), and the chemical vapor deposition of hydrocarbons (Ivanov et al. Chem. Phys. Lett 223: 329 (1994); Li et al. Science 274: 1701 (1996)). Multi-walled carbon nanotubes can be produced on a commercial scale by catalytic hydrocarbon cracking while single-walled carbon nanotubes are still produced on a gram scale. Present methods produce both single-walled and multi-walled carbon nanotubes, as well as other contaminants, and purification of SWNTs can be time consuming and expensive.

Generally, single-walled carbon nanotubes are preferred over multi-walled carbon nanotubes because they have unique mechanical and electronic properties. Defects are less likely to occur in single-walled carbon nanotubes because multi-walled carbon nanotubes can survive occasional defects by forming bridges between unsaturated carbon valances, while single-walled carbon nanotubes have no neighboring walls to compensate for defects. Defect-free single-walled nanotubes are expected to have remarkable mechanical, electronic and magnetic properties that could be tunable by varying the diameter, and chirality of the tube.

A method for the production of SWNTs is disclosed in U.S. Pat. No. 6,764,874 to Ruth Zhang et al. using thin nickel film, Fe/Co or Fe/Ni as the catalyst. In addition, PCT Publication No. WO 06/050903 to Sigurd Buchholz et al. discloses the use of Fe:Mo catalyst and the use of hydrogen gas in order to generate the catalyst. These method can not produce SWNTs on a commercial scale, and the quality of the SWNTs can be low.

The methods described above still produce significant by-products and/or low yields of SWNTs. Thus, there is a need for methods and processes for controllable synthesis of high quality carbon single walled nanotubes. Accordingly, the present invention provides novel methods and processes for the synthesis of high quality SWNTs.

SUMMARY

The present invention provides methods and processes for growing single-walled carbon nanotubes with high quality.

The methods use catalysts selected from a Group V metal, a Group VI metal, a Group VII metal, a Group VIII metal, a lanthanide, or a transition metal or combinations thereof. The catalyst can be supported on a powdered oxide, such as $Al_2O_3$, $SiO_2$, $MgO$ and the like, wherein the catalyst and the support are in a ratio of about 1:1 to about 1:500. The supported catalyst can be used for the synthesis of SWNTs. The reaction temperature, the reaction duration, and other reaction conditions can be altered until high-quality SWNTs are produced and the production of other carbon species, such as multi-walled carbon nanotubes, amorphous carbon, disordered carbon, or graphite is minimized.

In one aspect, the invention provides methods for synthesizing carbon single-walled nanotubes (SWNTs) wherein Fe:Mo metal catalyst is supported on alumina and contacted with a carbon precursor gas to synthesize high quality SWNTs wherein the hydrocarbon concentration is reduced. The reaction temperature is preferably less than the thermal decomposition temperature of the carbon precursor gas, and greater than the onset temperature of the SWNT synthesis under the given synthesis conditions.

In another aspect, the invention provides methods for synthesizing carbon single-walled nanotubes (SWNTs) wherein metal catalyst on a support in a ratio of about 1:10 to about 1:50 are contacted with a carbon precursor gas and high quality SWNTs are synthesized at a temperature of less than the thermal decomposition temperature of the carbon source, and wherein the pressure of the carbon precursor gas in the reaction chamber is less than about 200 torr.

In another aspect, the invention provides methods for synthesizing carbon single-walled nanotubes (SWNTs) wherein metal catalyst on a support in a ratio of about 1:10 to about 1:50 are contacted with a carbon precursor gas and high quality SWNTs are synthesized at a temperature of less than the thermal decomposition temperature of the carbon source, and wherein the carbon precursor gas is diluted with a carrier gas such that the partial pressure of the carbon source is less than about 200 torr, and the reaction is carried out at about atmosphere pressure.

These and other aspects of the present invention will become evident upon reference to the following detailed description. In addition, various references are set forth herein which describe in more detail certain procedures or compositions, and are therefore incorporated by reference in their entirety.

DETAILED DESCRIPTION

I. Definitions

Figure 1:
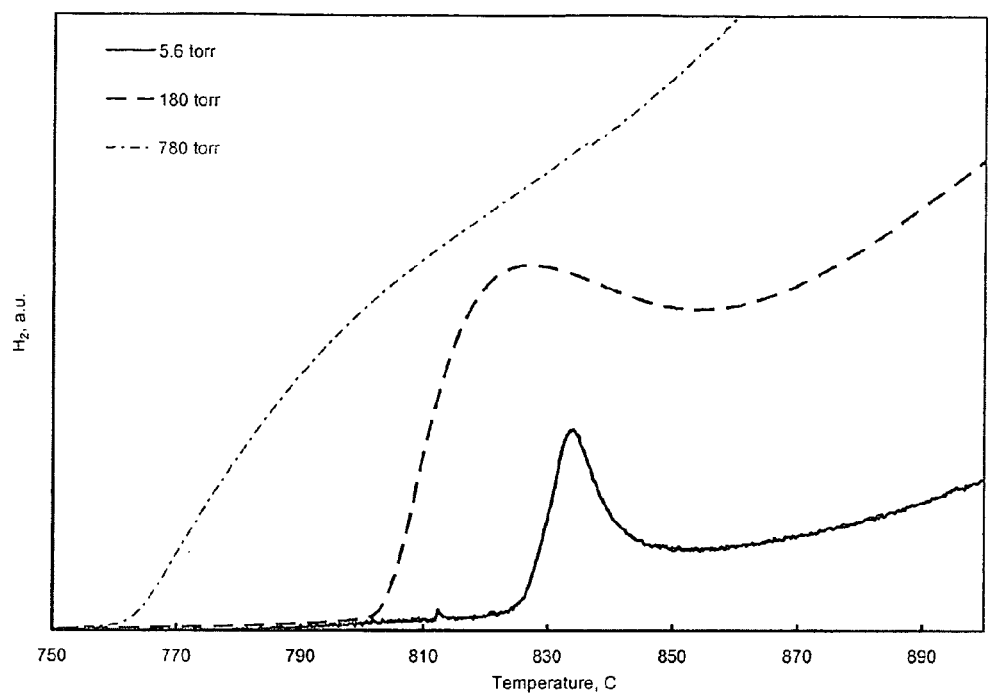
FIG. 1 depicts the temperature dependence of hydrogen evolution during the synthesis of single-walled carbon nanotubes using pure carbon source at different pressures.

Unless otherwise stated, the following terms used in this application, including the specification and claims, have the definitions given below. It must be noted that, as used in the specification and the appended claims, the singular forms "a," "an" and "the" include plural referents unless the context clearly dictates otherwise. Definition of standard chemistry terms may be found in reference works, including Carey and Sundberg (1992) "Advanced Organic Chemistry $3^{rd}$ Ed." Vols. A and B, Plenum Press, New York, and Cotton et al. (1999) "Advanced Inorganic Chemistry $6^{th}$ Ed." Wiley, New York.

The terms "single-walled carbon nanotube" or "one-dimensional carbon nanotube" are used interchangeable and refer to cylindrically shaped thin sheet of carbon atoms having a wall consisting essentially of a single layer of carbon atoms, and arranged in an hexagonal crystalline structure with a graphitic type of bonding.

The terms "metalorganic" or "organometallic" are used interchangeably and refer to co-ordination compounds of organic compounds and a metal, a transition metal or a metal halide.

II. Overview

The present invention discloses methods and processes for the synthesis of high quality carbon single-wall nanotubes (SWNT) and structures using the carbon vapor deposition method. Catalyst supported on powdered $Al_2O_3$ is used for the synthesis of SWNTs. The catalyst preferably is Fe and at least one other metal, such as Mo, Ni, and the like. The synthesis is preferably carried out at reduced concentration of the hydrocarbon precursor gas, and the temperature of the reaction is selected such that it is below the thermal decomposition temperature of the hydrocarbon precursor gas but is higher than the onset temperature of the SWNT synthesis by about 10° C. to about 50° C. The methods thus minimize the thermal decomposition, thereby minimizing the formation of amorphous or disordered carbon and the formation of multilayered carbon. Thus, high quality SWNTs are produced.

III. The Catalyst

The catalyst composition can be any catalyst composition known to those of skill in the art. Conveniently, the catalyst can be a metal or an alloy, such as, for example, iron, iron oxide, molybdenum, or a ferrite such as cobalt, nickel, chromium, yttrium, hafnium or manganese. The catalyst useful according to the invention will preferably have an average overall particle size of up to 5 nm to about 1 µnm, although, in general, the particle sizes for individual particles can be from about 1 µnm to about 5 nm.

The function of the catalyst when used in the carbon nanotube growth process is to decompose the carbon precursors and aid the deposition of ordered carbon. The methods and processes of the present invention preferably use metal nanoparticles as the metallic catalyst. The metal or combination of metals selected as the catalyst can be processed to obtain the desired particle size and diameter distribution. The catalyst can then be separated by being supported on a material suitable for use as a support during synthesis of carbon nanotubes as described below. As known in the art, the support can be used to separate the catalyst particles from each other thereby providing the catalyst materials with greater surface area in the catalyst composition. Such support materials include powders of crystalline silicon, polysilicon, silicon nitride, tungsten, magnesium, aluminum and their oxides, preferably aluminum oxide, silicon oxide, magnesium oxide, or titanium dioxide, or combination thereof, optionally modified by additional elements, are used as support powders. Silica, alumina and other materials known in the art may be used as support, preferably alumina is used as the support.

The catalyst can be selected from a Group V metal, such as V or Nb, and mixtures thereof, a Group VI metal including Cr, W, or Mo, and mixtures thereof, VII metal, such as, Mn, or Re, Group VIII metal including Co, Ni, Ru, Rh, Pd, Os, Ir, Pt, and mixtures thereof, or the lanthanides, such as Ce, Eu, Er, or Yb and mixtures thereof, or transition metals such as Cu, Ag, Au, Zn, Cd, Sc, Y, or La and mixtures thereof. Specific examples of mixture of catalysts, such as bimetallic catalysts, which may be employed by the present invention include Co—Cr, Co—W, Co—Mo, Ni—Cr, Ni—W, Ni—Mo, Ru—Cr, Ru—W, Ru—Mo, Rh—Cr, Rh—W, Rh—Mo, Pd—Cr, Pd—W, Pd—Mo, Ir—Cr, Pt—Cr, Pt—W, and Pt—Mo. Preferably, the metal catalyst is iron, cobalt, nickel, molybdenum, or a mixture thereof, such as Fe—Mo, Fe—Ni and Ni—Fe—Mo.

The ratio of each metal to the total catalyst is preferably from about 1:10 to about 15:1 (mol/mol), more preferably about 1:5 to about 5:1 (mol/mol), and even more preferably about 1:2 to about 1:4 (mol/mol). Thus, for example, if the catalyst is the bimetallic Fe—Mo, the ratio of Fe:Mo can be 1:1, 2:3, 1:2, 3:2, 5:1, 6:1 and the like. Similarly, if the catalyst is the trimetallic Fe—Mo—Ni, the ratio of Fe:Mo:Ni can be 1:1:1, 3:2:1, 5:1:1, 10:2:1, and the like.

The metal, bimetal, or combination of metals can be used to prepare the catalyst as nanoparticles, preferably having defined particle size and diameter distribution. The catalyst can be prepared using the literature procedure described in Harutyunyan et al., NanoLetters 2, 525 (2002). Alternatively, the catalyst can be prepared by thermal decomposition of the corresponding metal salt added to a passivating salt, and the temperature of the solvent adjusted to provide the metal nanoparticles, as described in the co-pending and co-owned U.S. patent application Ser. No. 10/304,316, or by any other method known in the art. The size and diameter of the catalyst can be controlled by using the appropriate concentration of metal in the passivating solvent and by controlling the length of time the reaction is allowed to proceed at the thermal decomposition temperature. The metal salt can be any salt of the metal, and can be selected such that the melting point of the metal salt is lower than the boiling point of the passivating solvent. Thus, the metal salt contains the metal ion and a counter ion, where the counter ion can be nitrate, nitride, perchlorate, sulfate, sulfide, acetate, halide, oxide, such as methoxide or ethoxide, acetylacetonate, and the like. For example, the metal salt can be iron acetate ($FeAc_2$), nickel acetate ($NiAc_2$), palladium acetate ($PdAc_2$), molybdenum acetate ($MoAc_3$), and the like, and combinations thereof. The melting point of the metal salt is preferably about 5° C. to 50° C. lower than the boiling point, more preferably about 5° C. to about 20° C. lower than the boiling point of the passivating solvent. The solvent can be an ether, such as a glycol ether, 2-(2-butoxyethoxy)ethanol, $H(OCH_2CH_2)_2O(CH_2)_3CH_3$, which will be referred to below using the common name dietheylene glycol mono-n-butyl ether, and the like.

Catalysts having an average particle size of about 0.01 nm to about 20 nm, more preferably about 0.1 nm to about 3 nm and most preferably about 0.3 nm to 2 nm can be prepared. The catalysts can thus have a particle size of 0.1, 1, 2, 3, 4, 5, 6, 7, 8, 9, or 10 nm, and up to about 20 nm. In another aspect, the catalysts can have a range of particle size, or diameter distribution. For example, the catalysts can have particle sizes in the range of about 0.1 nm and about 5 nm in size, about 3 nm and about 7 nm in size, or about 5 nm and about 11 nm in size.

The size and distribution of catalyst produced can be verified by any suitable method. One method of verification is transmission electron microscopy (TEM). A suitable model is the Phillips CM300 FEG TEM that is commercially available from FEI Company of Hillsboro, Oreg. In order to take TEM micrographs of the metal nanoparticles, 1 or more drops of the metal nanoparticle/passivating solvent solution are placed on a carbon membrane grid or other grid suitable for obtaining TEM micrographs. The TEM apparatus is then used to obtain micrographs of the nanoparticles that can be used to determine the distribution of nanoparticle sizes created.

In another method, the size of the catalyst particle, before and after being supported, can be determined using superconducting quantum interference device (SQUID) magnetometer, as described in the co-pending and co-owned application U.S. Ser. No. 10/992,275. SQUID magnetometers are commercially available from companies such as Biomagnetic Technologies Inc., San Diego, Calif. and Siemens AG of Germany, and include both single and multichannel devices that are capable of detecting magnetic fields at plurality of locations simultaneously. SQUID magnetometers generally comprise a superconducting pick up coil system and a detector system (the SQUID) which itself comprises one or two Josephson junctions inserted into a loop of superconducting wire. The magnetic flux within such loops is quantized and changes in the magnetic field experienced by the pick up coils cause a measurable change in the current flowing through the detector. The SQUID magnetometers are capable of measuring very low magnetic fields, for example, as low as $10^{-14}$ Tesla. The technique thus finds use in a variety of fields.

It has been found that the magnetization curves for catalysts having particle sizes of less than about 1.5 nm is paramagnetic, and the magnetization curves for particle sizes greater than about 2 nm is superparamagnetic, and greater than 4 nm is ferromagnetic Thus, in one aspect, the evolution of magnetic properties of the catalyst particles can be used for verification of the catalyst particle size after the synthesis. The metal/support material molar ratio can be varied if the magnetization curves observed in SQUID are not the same as the magnetization curves expected for the desired particle sizes. Thus, if the desired average particle size is about 2 nm or greater, such as between 2.1 nm and about 3 nm, then the variation of the metal/support material ratio is continued until the SQUID measurements provide magnetization curves indicating that the particles are superparamagnetic.

The catalysts, such as those formed by thermal decomposition described in detail above, and optionally characterized by SQUID, can then be supported on solid supports. The solid support can be alumina, silica, MCM-41, MgO, $ZrO_2$, aluminum-stabilized magnesium oxide, zeolites, or other oxidic supports known in the art, and combinations thereof. For example, $Al_2O_3$—$SiO_2$ hybrid support could be used. Preferably, the support is aluminum oxide ($Al_2O_3$) or silica ($SiO_2$). The oxide used as solid support can be powdered thereby providing small particle sizes and large surface areas. The powdered oxide can preferably have a particle size between about 0.01 µm to about 100 µm, more preferably about 0.1 µm to about 10 µm, even more preferably about 0.5 µm to about 5 µm, and most preferably about 1 µm to about 2 µm. The powdered oxide can have a surface area of about 50 to about 1000 $m^2/g$, more preferably a surface area of about 200 to about 800 $m^2/g$. The powdered oxide can be freshly prepared or commercially available.

In one aspect, the catalysts are supported on solid supports via secondary dispersion and extraction. Secondary dispersion begins by introducing particles of a powdered oxide, such as aluminum oxide ($Al_2O_3$) or silica ($SiO_2$), into the reaction vessel after the thermal decomposition reaction. A suitable $Al_2O_3$ powder with 1-2 µm particle size and having a surface area of 300-500 $m^2/g$ is commercially available from Alfa Aesar of Ward Hill, Mass., or Degussa, N.J. Powdered oxide can be added to achieve a desired weight ratio between the initial amount of the catalyst and the powdered oxide used to form the supported catalysts. Typically, the weight ratio can be between about 1:10 and about 1:50. For example, if 100 mg of iron acetate is used as the starting catalyst material, then about 320 to 480 mg of powdered oxide can be introduced into the solution. The weight ratio of catalyst to powdered oxide can be between about 1:10 and 1:20, such as, for example, 1:11, 1:12, 2:25, 3:37, 1:13, 1:14, 1:15, 1:16, 1:17, and the like.

As will be apparent to those of skill in the art, the supported catalyst thus prepared can be stored for later use. In another aspect, the catalyst can be previously prepared, isolated from the passivating solvent, and purified, and then added to a powdered oxide in a suitable volume of the same or different passivating solvent. The metal nanoparticles and powdered oxide can be homogenously dispersed, extracted from the passivating solvent, and processed to increase the effective surface area as described above. Other methods for preparing the metal nanoparticles and powdered oxide mixture will be apparent to those skilled in the art.

The supported catalysts thus formed can be used as a growth catalyst for synthesis of carbon nanotubes, nanofibers, and other one-dimensional carbon nanostructures using the chemical vapor deposition (CVD) process.

IV. Carbon Precursors

The carbon nanotubes can be synthesized using carbon precursors, such as carbon containing gases. In general, any carbon containing gas that does not pyrolize at temperatures up to 800° C. to 1200° C. can be used for give flow rate. Examples of suitable carbon-containing gases include carbon monoxide, aliphatic hydrocarbons, both saturated and unsaturated, such as methane, ethane, propane, butane, pentane, hexane, ethylene, acetylene and propylene; oxygenated hydrocarbons such as acetone, and methanol; aromatic hydrocarbons such as benzene, toluene, and naphthalene; and mixtures of the above, for example carbon monoxide and methane. In general, the use of acetylene promotes formation of multi-walled carbon nanotubes, while CO and methane are preferred feed gases for formation of single-walled carbon nanotubes. The carbon-containing gas may optionally be mixed with a diluent gas such as hydrogen, helium, argon, neon, krypton and xenon or a mixture thereof.

V. Synthesis of Carbon Nanotubes

The methods and processes of the invention provide for the synthesis of SWNTs having high quality. In one aspect of the invention, the catalyst supported on powdered oxides can be contacted with the carbon source at the reaction temperatures according to the literature methods described in Harutyunyan et al., NanoLetters 2, 525 (2002). Alternatively, the catalysts supported on the oxide powder can be aerosolized and introduced into the reactor maintained at the reaction temperature. Concurrently, the carbon precursor gas can be introduced into the reactor. The flow of reactants within the reactor can be controlled such that the deposition of the carbon products on the walls of the reactor is reduced. The carbon nanotubes thus produced can be collected and separated.

The catalysts supported on the oxide powder can be aerosolized by any of the art known methods. In one method, the supported catalysts are aerosolized using an inert gas, such as helium, neon, argon, krypton, xenon, or radon. Preferably argon is used. Typically, argon, or any other gas, is forced through a particle injector, and into the reactor. The particle injector can be any vessel that is capable of containing the supported catalysts and that has a means of agitating the supported catalysts. Thus, the catalyst deposited on a powdered porous oxide substrate can be placed in a beaker that has a mechanical stirrer attached to it. The supported catalyst can be stirred or mixed in order to assist the entrainment of the catalyst in the transporter gas, such as argon.

Thus, the nanotube synthesis generally occurs as described in the co-pending and co-owned application U.S. Ser. No. 10/727,707, filed on Dec. 3, 2003. An inert transporter gas, preferably argon gas, is generally passed through a particle injector. The particle injector can be a beaker or other vessel containing the growth catalyst supported on a powdered porous oxide substrate. The supported catalyst in the particle injector can be stirred or mixed in order to assist the entrainment of the supported catalyst in the argon gas flow. Optionally, the inert gas can be passed through a drying system to dry the gas. The argon gas, with the entrained powdered porous oxide, can then be passed through a pre-heater to raise the temperature of this gas flow to about 400° C. to about 500° C. The entrained supported catalyst can then be delivered to the reaction chamber.

In one aspect of the invention, the carbon source gas, such as methane or carbon monoxide, is delivered to the reaction chamber at reduced pressure. The pressure of the carbon source gas can be about 0.01 torr to about 600 torr, preferably about 5 torr to about 200 torr. In certain aspects, the total pressure of the gas is about 740 torr to about 780 torr. The pressure is selected such that the decomposition of the carbon source occurs at temperatures above about 825° C., more preferably at temperatures above about 850° C., or more preferably at temperatures above about 875° C. For example, when the carbon source is methane, and the catalyst is Fe:Mo:$Al_2O_3$ (1:0.2:40), the onset of the decomposition of methane begins at 760° C. at 780 torr pressure (1.025 atm), at 785-800° C. at 180 torr (0.24 atm), and at 825° C. at 5.6 torr (0.0074 atm). Thus, decreasing the hydrocarbon concentration by using reduced pressure results in an increase in the synthesis temperature, thereby producing higher quality SWNTs. Thus, in one aspect of the invention, the carbon source gas can be delivered at a reduced pressure such that the temperature is less than about 1000° C., but the onset temperature of the SWNT nucleation is increased over the onset temperature at atmospheric pressure by at least about 15° C., more preferably about 25° C., or even more preferably about 30° C.

In another aspect of the invention, the carbon source gas, such as methane, can be mixed with another gas and then delivered to the reaction chamber, preferably at about atmosphere pressure (750 torr). For example, the ratio of partial pressures of the carbon source gas to the inert gas can be about 1:500 to about 1:1, preferably about 1:100 to about 1:10, or more preferably about 1:50 to about 1:12. Thus the pressure can be about 0.9 to about 1.5 atmosphere, preferably about 1 to about 1.1 atmosphere, or more preferably about 1.0 to about 1.05 atmosphere. Thus, typical flow rates can be 200 sccm for argon or helium and 5 sccm for methane, to give a total pressure of 1.025 atmospheres (780 torr) for the synthesis of higher quality SWNTs.

The temperature of the reaction chamber can be selected to be between about 300° C. and 900° C. In certain aspects, the reaction temperature is between about 600° C. and 1200° C. The temperature can be selected such that it is preferably kept below the decomposition temperature of the carbon precursor gas. For example, at temperatures above 1000° C., methane is known to break down directly into soot rather than forming carbon nanostructures with the metal growth catalyst. Further, the temperature can be selected such that the formation of non-SWNT products, such as amorphous or disordered carbon, graphite, or multi-walled carbon nanotubes, is minimized. Carbon nanotubes and other carbon nanostructures synthesized in reaction chamber can then be collected and characterized. Thus, when the concentration of the carbon source is reduced by dilution with argon, the onset temperature was found to be 785° C. and when the concentration of the carbon source is reduced by dilution with helium, the onset temperature was found to be 795° C.

In one aspect of the invention, the diameter distribution of the synthesized SWNTs is substantially uniform. Thus, about 90% of the SWNTs have a diameter within about 25% of the mean diameter, more preferably, within about 20% of the mean diameter, and even more preferably, within about 15% of the mean diameter. Thus, the diameter distribution of the synthesized SWNTs can be about 10% to about 25% within the mean diameter, more preferably about 10% to about 20% of the mean diameter, and even more preferably about 10% to about 15% of the mean diameter.

Carbon SWNTs can be synthesized with the yields ranging from about 1 wt % to about 100 wt % (wt % carbon relative to the iron/alumina catalyst). Analysis of transmission electron microscopy (TEM) images of SWNTs produced can be correlated with the size of the catalyst particles. For example, SWNTs can be produced as bundles having an average diameter of about 10 nm to about 15 nm when catalyst particle size is about 9 nm, having an average diameter of about 7 nm to about 12 nm when catalyst particle size is about 5 nm, and having an average diameter about 5 nm to about 10 nm when catalyst particle size is about 1 nm. The diameters estimated from TEM can be confirmed from the radial breathing modes observed by Raman Spectroscopy spectra, using multiple different laser excitations, such as, for example, $\lambda$=1064; 785; 614, 532, 514 and 488 nm.

The Raman spectra of SWNTs has three major peaks, which are the G-band at about 1590 $cm^{-1}$, D-band at about 1350 $cm^{-1}$, and the Radial breathing mode (RBM) at about 100-300 $cm^{-1}$. RBM frequency is proportional to an inverse of the diameter of SWNTs and can thus be used to calculate the diameter of the SWNT. Normally, a red shift in RBM peak corresponds to an increase in the mean diameter of SWNTs. The tangential mode G-band related to the Raman-allowed phonon mode $E_{2g}$ can be a superposition of two peaks. The double peak at about 1593 and 1568 $cm^{-1}$ has been assigned to semiconductor SWNTs, while the broad Breit-Wigner-Fano line at about 1550 $cm^{-1}$ has been assigned to metallic SWNTs. Thus, G-band offers a method for distinguishing between metallic and semiconducting SWNTs. The D-band structure is related to disordered carbon, the presence of amorphous carbon, and other defects due to the $sp^2$-carbon network. The ratio of the G-band to D-band in the Raman spectra ($I_G:I_D$ or G/D ratio) of SWNTs can be used as an index to determine the purity and quality of the SWNTs produced. Preferably, $I_G:I_D$ is about 1 to about 500, preferably about 5 to about 400, more preferably greater than about 7. In certain aspects, SWNTs are synthesized with a ratio of G-band to D-band in Raman spectra ($I_G:I_D$) of less than about 100. In other aspects SWNTs are synthesized with a ratio of G-band to D-band in Raman spectra ($I_G:I_D$) of greater than about 100. In further aspects, SWNTs are synthesized with a ratio of G-band to D-band in Raman spectra ($I_G:I_D$) of greater than about 5.

The concentration of the carbon source in the reaction chamber and reaction duration can be varied to obtain SWNTs of high quality. For example, the reaction temperature can be from about 400° C. to about 950° C., preferably from about 750° C. to about 900° C., or more preferably from about from about 800° C. to about 875° C. The SWNTs produced at the initial setting can be tested for their quality, and the temperature adjusted such that the quality of SWNTs reaches the desired level. Preferably, the reaction temperature is between about 800° C. and 900° C., and the reaction duration is from about 1 min to about 180 min, preferably from about 10 min to about 120 min, more preferably from about 10 min to about 100 min. The quality of the SWNTs produced can be tested, and the reaction duration adjusted such that the quality of SWNTs reaches the desired level. Preferably, the reaction duration is less than about 90 min.

Using the methods and processes of the invention, high quality SWNTs with $I_G:I_D$ of about 4 to about 500 can be manufactured. The quality of the SWNTs can be controlled by controlling the particle size of the catalyst, the temperature of the reaction, the duration of the reaction, and the concentration of the carbon source gas. In particular, the concentration of the carbon source is decreased such that the onset temperature is increased to about 800° C. to about 900° C., where the concentration can be decreased by either reducing the pressure of the pure carbon source or by diluting the carbon source with an inert gas. The SWNTs thus produced are of greater purity and quality.

The carbon nanotubes and nanostructures produced by the methods and processes described above can be used in applications that include Field Emission Devices, Memory devices (high-density memory arrays, memory logic switching arrays), Nano-MEMs, AFM imaging probes, distributed diagnostics sensors, and strain sensors. Other key applications include: thermal control materials, super strength and light weight reinforcement and nanocomposites, EMI shielding materials, catalytic support, gas storage materials, high surface area electrodes, and light weight conductor cable and wires, and the like.

EXAMPLES

Below are examples of specific embodiments for carrying out the present invention. The examples are offered for illustrative purposes only, and are not intended to limit the scope of the present invention in any way. Efforts have been made to ensure accuracy with respect to numbers used (e.g., amounts, temperatures, etc.), but some experimental error and deviation should, of course, be allowed for.

Example 1

Preparation of the Supported Catalyst

Alumina aerogel supported bimetallic Fe/Mo catalyst (with molar ratio Fe:Mo:$Al_2O_3$ of 1:0.2:10.16) was prepared using the sol-gel method followed by supercritical drying. 5.28 g of aluminum sec-butoxide (97%, Alfa Aesar) was diluted in 35 ml of heated 200 proof ethanol and then 20 ml of 4 μg/ml of $HNO_3$ solution in ethanol was added. The mixture was refluxed at 80° C. with stirring for 2 hours. Then a solution of 426.5 mg of iron (III) nitrate hydrate (99.999%, Puratronic by Alfa Aesar) and 68.7 mg of molybdenum (VI) oxide bis(2,4-pentanedionate) (99%, Alfa Aesar) in 20 ml of ethanol was added. The mixture was refluxed at 80° C. with stirring for 1 hour and then cooled to room temperature. To the room temperature solution was added a solution of 1 ml of ammonium hydroxide (trace metal grade, Fisher) and 1 ml of distilled water in 5 ml of ethanol, under intensive stirring that caused gelation. The gel was left to age overnight and supercritically dried at 270° C. and >100 atm the following day. The aerogel powder was calcinated in air flow at 500° C. for 1 hour and heat-treated in argon flow at 820° C. for 1 hour.

The catalyst was also be prepared using the method described in Harutyunyan et al., NanoLetters 2, 525 (2002). Alternatively, the catalyst was prepared by impregnating support materials in metal salt solutions. The reaction time and metal salt/glycol ratio were changed to control the sizes of nanoparticles. In a typical procedure, $FeAc_2$ in methanol and $MoAc_2$ in methanol were used at a molar ratio of Fe:Mo:$Al_2O_3$ of 1:0.2:17. Under a nitrogen atmosphere, $FeAc_2$ and $MoAc_2$ were added to dietheylene glycol mono-n-butyl ether in the molar ratio of 1 mM:0.2 mM:20 mM. The reaction mixture was mixed under the nitrogen atmosphere using a magnetic stir bar, and heated under reflux for 90 minutes. The reaction mixture was then cooled to room temperature, and $Al_2O_3$ (17 mM) was added at once (molar ratio Fe:Mo:$Al_2O_3$=1:0.2:17). The reaction solution was stirred at room temperature for 15 minutes, and then heated to 150° C. for 3 hours. The reaction was cooled to 90° C. while flowing a stream of $N_2$ over the mixture to remove the solvent. A black film formed on the walls of the reaction flask. The black film was collected and ground with an agate mortar to obtain a fine black powder.

Example 2

Synthesis of Carbon Nanotubes

Carbon nanotubes were synthesized by using the experimental setup described in Harutyunyan et al., NanoLetters 2, 525 (2002). CVD growth of SWNTs with the catalysts produced above used methane as a carbon source. The single-walled carbon nanotubes thus produced were characterized using Raman spectra of carbon SWNTs using λ=532 nm laser excitation. In general, high concentration of the methane resulted in a very significant thermal decomposition of methane and heavy contamination of the reactor walls with carbon. Decrease of the methane concentration reduced this contamination. D-band of the Raman spectra of the synthesized nanotube material also decreased with the decrease of the methane concentration indicating decrease of the portion of amorphous carbon.

Figure 3:
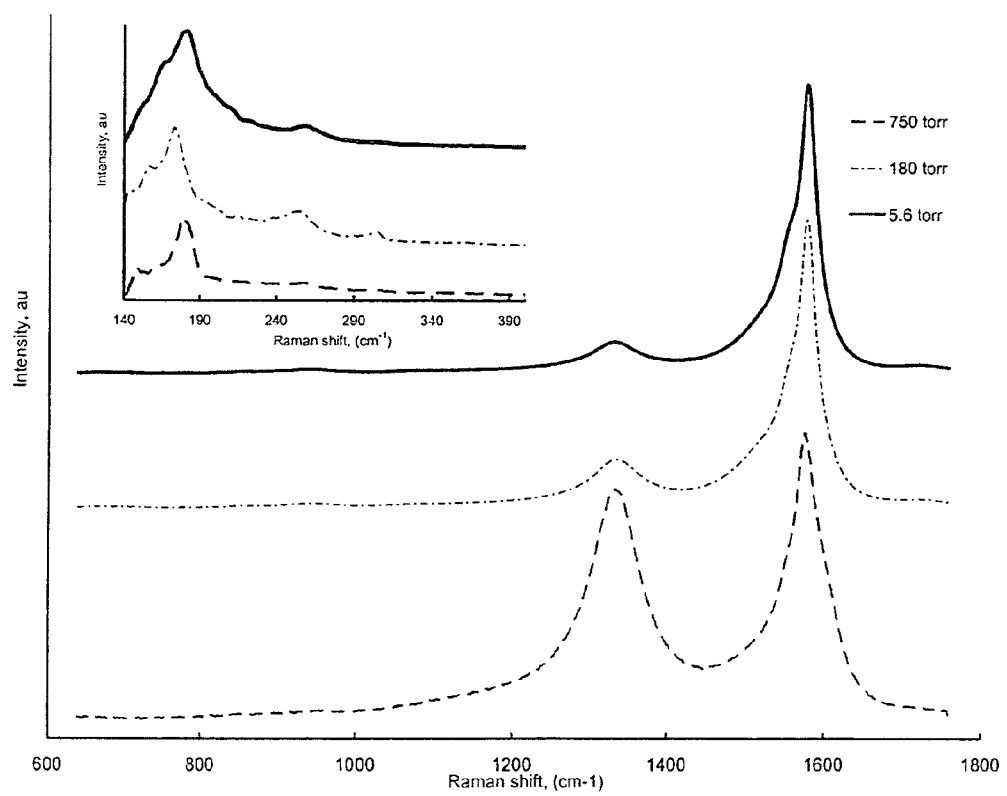
FIG. 3 depicts the Raman spectra of carbon SWNTs grown using the pure carbon source at different pressures.

The reaction was carried out using 1:0.2:40 (Fe:Mo:$Al_2O_3$) aerogel catalyst and methane as the carbon source. The concentration of methane in the reaction chamber was manipulated using different pressures, as illustrated in FIG. 1. The use of 100% methane at 780 torr pressure (1.025 atm) resulted in methane starting to decompose at 760° C. When the pressure was decreased to 180 torr (0.24 atm), methane began decomposing at 785-800° C., and when the pressure was decreased to 5.6 torr (0.0074 atm), methane began decomposing at 825° C. The use of different heating rates did not affect the onset of decomposition temperature. A heating rate of 1 C/min (815 C and 840 C for 6 torr) and 5 C/min (825 C for 5.6 torr) show comparable onset temperatures. The quality of the SWNTs produced at these different pressures is shown in FIG. 3, and is consistent with the synthesis of high quality of SWNTs.

Example 3

Synthesis of Carbon Nanotubes

Carbon nanotubes were synthesized and characterized as described in Example 2, except the concentration of the carbon source was controlled by the addition of an inert gas and the reaction was performed at atmospheric pressure.

Figure 2:
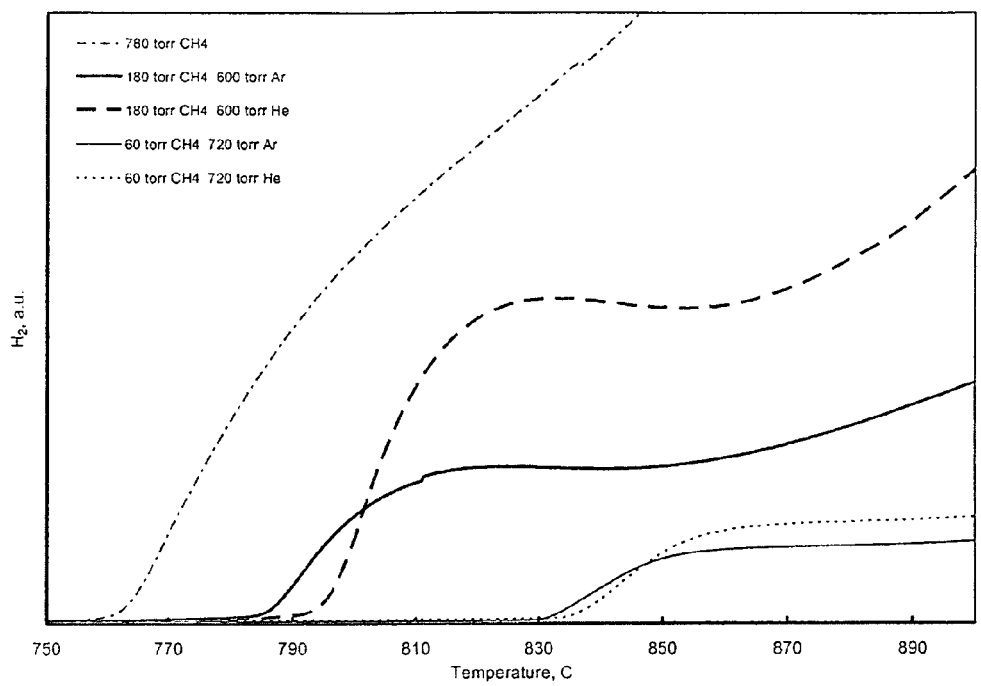
FIG. 2 depicts the temperature dependence of hydrogen evolution during the synthesis of single-walled carbon nanotubes using carbon source diluted with a carrier gas at atmospheric pressure.

The concentration of methane in the reaction chamber was manipulated by mixing methane with either argon or helium, as illustrated in FIG. 2. For the mixture of 180 torr methane and 600 torr argon (total pressure 780 torr=1.025 atm, 60 sccm $CH_4$+200 sccm Ar), the onset temperature was 785° C. while for the mixture of 180 torr methane and 600 torr helium (total pressure 780 torr=1.025 atm, 60 sccm CH$_4$+200 sccm He) the onset temperature was 795° C. Both onset temperatures are comparable to that of the 180 torr pure methane.

The flow rates of the gas mixtures were reduced 5 fold (from 260 sccm to 52 sccm), but the proportion of the gases, and, thus, their partial pressures were maintained (12 sccm CH$_4$+40 sccm of Ar, total pressure 780 torr), the onset temperatures was 793° C., the same as that of the 260 sccm experiment. Thus, the flow rate does not significantly affect the onset of the decomposition temperature.

Figure 4:
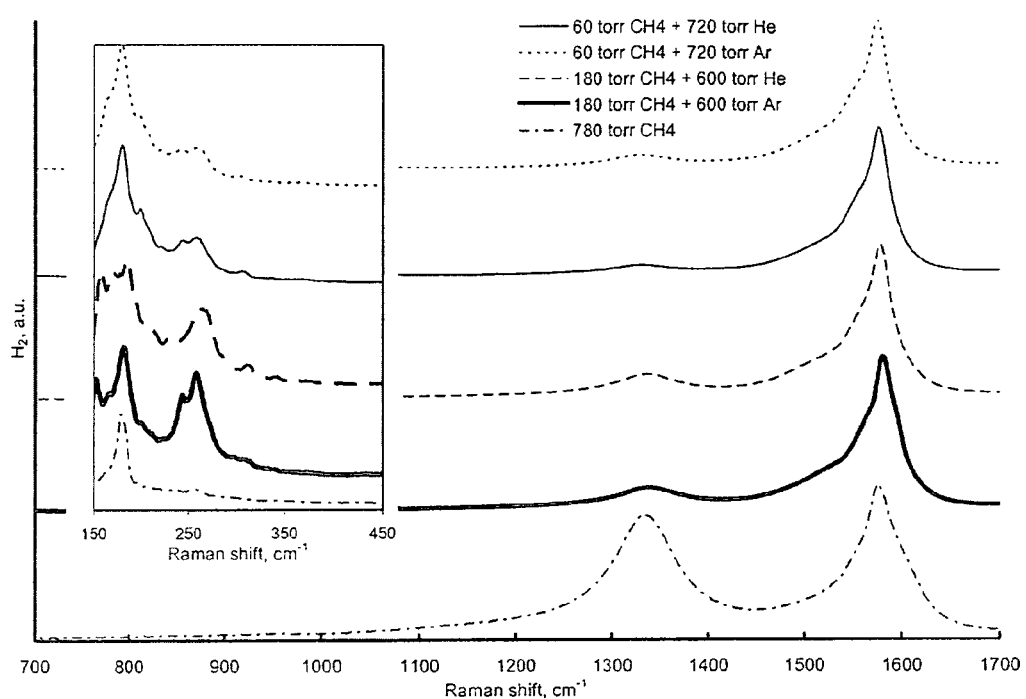
FIG. 4 depicts the Raman spectra of carbon SWNTs grown using carbon source diluted with a carrier gas at atmospheric pressure.

Further dilution of the methane with the carrier gas (8 sccm CH$_4$+100 sccm Ar or He, 780 torr total pressure) lead to increase of the onset temperatures to 830° C. for Ar and 835° C. for He, comparable to the onset temperature for 6 torr pure methane (825° C.). Thus, the onset temperature seems to depend mostly on the concentration (partial pressure) of the carbon source (methane), regardless of the method of creating the concentration (pumping out or dilution with the carrier gas). The nature of the carrier gas (Ar, He, "vacuum") does not seems to have a significant effect on the onset temperature. The change of the flow rate (within the tested limits) also has little effect on the onset temperature. The quality of the SWNTs produced at these different pressures is shown in FIG. 4, and is consistent with the synthesis of high quality of SWNTs.

Therefore, higher quality SWCNT can be synthesized using CVD at low concentrations of carbon source (methane). The method has the advantage of reducing the portion of amorphous carbon and produces less defective SWNT since they are synthesized at higher temperatures.

While the invention has been particularly shown and described with reference to a preferred embodiment and various alternate embodiments, it will be understood by persons skilled in the relevant art that various changes in form and details can be made therein without departing from the spirit and scope of the invention. All printed patents and publications referred to in this application are hereby incorporated herein in their entirety by this reference.

We claim:

1. A method for synthesizing carbon single-walled nanotubes (SWNTs), the method comprising the steps of:
    providing a metal catalyst on a support wherein the metal catalyst and the support are in a mass ratio of between about 1:1 to about 1:500;
    contacting the catalyst with a carbon-containing gas selected from a group consisting of methane, ethane, propane, butane, pentane and hexane at a partial pressure of about 5 torr to about 200 torr, and the total pressure of the gas is about 740 torr to about 780 torr; and
    providing a reaction temperature between about 600° C. and 1200° C., wherein SWNTs are synthesized with a ratio of G-band to D-band in Raman spectra ($I_G$:$I_D$) of greater than about 100,
    wherein the partial pressure of the methane, ethane, propane, butane, pentane or hexane is 180 torr and the gas has a total pressure of 780 torr.

2. The method of claim 1, wherein the metal catalyst comprises a Group V metal, a Group VI metal, a Group VII metal, a Group VIII metal, a lanthanide, a transition metal, or a mixture thereof.

3. The method of claim 2, wherein the metal catalyst comprises Fe and a second metal, wherein the second metal is V, Nb, Cr, W, Mo, Mn, Re, Co, Ni, Ru, Rh, Pd, Os, Ir, Pt, Ce, Eu, Er, Yb, Ag, Au, Zn, Cd, Sc, Y, La, or a mixture thereof.

4. The method of claim 3, wherein the second metal comprise Ni, Co, Cr, Mo, or a mixture thereof.

5. The method of claim 4, wherein the metal catalyst comprises a mixture of Fe and Mo.

6. The method of claim 1, wherein the support comprises a powdered oxide.

7. The method of claim 6, wherein the powdered oxide comprises $Al_2O_3$, $SiO_2$, MgO, or zeolites.

8. The method of claim 7, wherein the powdered oxide comprises $Al_2O_3$.

9. The method of claim 1, wherein the metal catalyst and the support are in a mass ratio of about 1:10 to about 1:20.

10. The method of claim 1, wherein the gas comprises methane.

11. The method of claim 1, wherein the gas further comprises an inert gas.

12. The method of claim 11, wherein the inert gas comprises argon, helium, nitrogen, or a mixture thereof.

13. The method of claim 1 wherein the reaction temperature is between about 800° C. and 900° C.

\* \* \* \* \*